United States Patent [19]

Kenney

[11] Patent Number: 4,511,911
[45] Date of Patent: Apr. 16, 1985

[54] DENSE DYNAMIC MEMORY CELL STRUCTURE AND PROCESS

[75] Inventor: Donald M. Kenney, Shelburne, Vt.

[73] Assignee: International Business Machines Corporation, Armonk, N.Y.

[21] Appl. No.: 286,110

[22] Filed: Jul. 22, 1981

[51] Int. Cl.³ .................. H01L 29/78; H01L 27/02; H01L 29/34; H01L 27/10

[52] U.S. Cl. .................. 357/23.6; 357/23.12; 357/23.1; 357/23.11; 357/41; 357/49; 357/52; 365/186

[58] Field of Search .............. 357/23 C, 23 D, 23 R, 357/41, 52 T, 52 R, 49, 23 CS; 365/186

[56] References Cited

U.S. PATENT DOCUMENTS

| | | | |
|---|---|---|---|
| 3,333,168 | 7/1967 | Hotstein | 357/23 MG |
| 3,387,286 | 6/1968 | Dennard | 340/173 |
| 3,453,506 | 7/1969 | Okumura | 357/23 C |
| 3,767,983 | 10/1973 | Berglund | 357/23 R |
| 3,811,076 | 5/1974 | Smith | 357/41 |
| 3,841,926 | 10/1974 | Garnache et al. | 148/188 |
| 4,014,036 | 3/1977 | Ho et al. | 357/23 C |
| 4,017,883 | 4/1977 | Ho et al. | 357/23 C |
| 4,135,289 | 1/1979 | Brews et al. | 357/23 C X |
| 4,164,751 | 8/1979 | Tasch | 357/24 X |
| 4,326,331 | 4/1982 | Guterman | 357/41 X |
| 4,373,965 | 2/1983 | Smigelski | 357/52 X |

OTHER PUBLICATIONS

Bearse, S. V., "Alternatives Weighed for MOS Capacitors", *Microwaves*, vol. 15, No. 5, pp. 9, 13, May 1976.
Kroell et al, "Field Shield MOS Transistor with Self-Aligned Gate", IBM Tech. Discl. Bull., vol. 16, No. 6, Nov. 1973, pp. 1860-1861.

*Primary Examiner*—Martin H. Edlow
*Assistant Examiner*—Jerome Jackson
*Attorney, Agent, or Firm*—Stephen J. Limanek

[57] ABSTRACT

A dynamic memory is provided having a cell with an improved structure and made by an improved process which substantially reduces the capacitance of the bit/sense line connected to the cell. The cell has one field effect transistor and a storage node, and the cell structure includes a thick insulating segment located under a portion of a conductive layer or field shield and under a portion of the gate electrode of the transistor, while extending over the entire diffusion region of the bit/sense line and over substantially the entire depletion region surrounding the bit/sense line diffusion region.

9 Claims, 5 Drawing Figures

DENSE DYNAMIC MEMORY CELL STRUCTURE AND PROCESS

TECHNICAL FIELD

This invention relates to an integrated semiconductor memory structure and process, and more particularly to a structure and process for making a dynamic one device memory cell which uses a single field effect transistor and a storage capacitor for storing binary digits of information.

BACKGROUND ART

Integrated semiconductor memory circuits, particularly those employing cells which include essentially a storage capacitor and a switch have achieved relatively high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/-sense line. In also commonly assigned U.S. Pat. No. 3,811,076 by W. M. Smith and U.S. Pat. No. 3,841,926 by R. H. Garnache and W. M. Smith, both filed Jan. 2, 1973, there is disclosed a one device field effect transistor memory cell of the type described in the above identified Dennard patent which is made to a small size by utilizing a layer of doped polysilicon and an N+ diffusion region in a P type semiconductor substrate separated by a dielectric medium disposed on the surface of the semiconductor substrate for forming the storage capacitor of the cell. The polysilicon layer extends beyond the storage capacitor to act as a field shield between adjacent cells by applying a negative bias or fixed negative potential to the polysilicon layer. The N+ diffusion region of the storage capacitor is formed by using a doped segment of an insulating layer disposed on the surface of the semiconductor substrate and out diffusing the dopant into the substrate. When the doped insulating segment is formed for the storage capacitor, another such segment is formed to provide a second N+ diffusion region which acts as the bit/sense line of the cell. As can be understood, with the bit/sense line using an N+ diffusion region or strip in the presence of a conductive polysilicon layer or field shield, care must be exercised to minimize the bit/sense line capacitance particularly since a single bit/sense line is often connected to one hundred or more cells. In an effort to minimize the bit/sense line capacitance, it is known to retain the doped insulating segment in position even after the dopant thereof has been diffused into the semiconductor substrate to form the N+ diffused bit/sense lines. By retaining this insulating segment over the N+ diffused bit/sense line, the field shield is more remotely spaced from at least portions of the bit/sense line providing a decrease in the bit/sense line capacitance and thus improving the transfer ratio between the bit/sense line and the associated storage capacitors. Although retaining the doped insulating segment over the bit/sense line decreases the bit/sense line capacitance, in view of the small size of the storage capacitances desired in current memories, further reduction in the bit/sense line capacitance is necessary in order to maintain a satisfactory transfer ratio between the small storage capacitance of the cell and the bit/sense line capacitance into which the signal or data is fed from the storage capacitance.

DISCLOSURE OF THE INVENTION

It is an object of this invention to provide an improved memory cell structure wherein the capacitance of the bit/sense line connected to the cell is substantially minimized.

It is another object of this invention to provide an improved process for making a memory cell structure which minimizes the bit/sense line capacitance.

It is yet another object of this invention to provide an improved memory cell structure wherein a thick insulating layer is disposed over the entire N+ diffusion region of the bit/sense line while employing a simple method of fabrication.

It is still another object of this invention to provide an improved dynamic one device memory cell structure in a memory array which has a very high density of cells and high performance.

In accordance with the teachings of this invention, a memory is provided having a cell with an improved cell structure and a process for making same which substantially reduces the capacitance of the bit/sense line connected to the cell. The cell structure includes a thick insulating layer located under a field shield or conductive layer and over the entire diffusion region of a bit/sense line with a portion of the thick insulating layer, such as the portion known as the bird's beak, extending beyond the diffusion region into the channel region under the gate electrode of the field effect transistor of the cell disposed between the bit/sense line diffusion region and the storage capacitor diffusion region of the cell.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
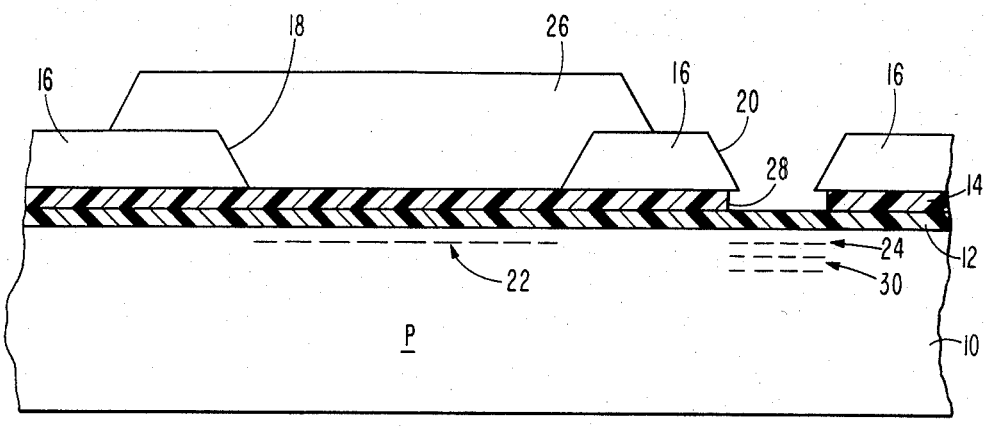
FIGS. 1-4 are sectional views of the memory cell of the present invention made after successive steps during the fabrication thereof in accordance with one process of this invention.

Referring to the drawings in more detail, there is illustrated in FIG. 1 a sectional view of the memory cell of the present invention during an early stage of the fabrication thereof. The cell includes a semiconductor substrate 10, preferably made of P type material, having first and second insulating layers 12 and 14 disposed on the surface thereof. The first layer 12 is preferably a layer of silicon dioxide of about 300 angstroms grown from the substrate 10, as is well known, and the second layer 14 is preferably a layer of silicon nitride also of about 300 angstroms deposited on the first layer 12. A first layer of photo resist 16 is deposited over the silicon nitride layer 14 and first and second openings 18 and 20 are formed therein using any known processing technique. By employing known ion implantation techniques, an N type impurity, preferably arsenic ions, is introduced into the surface of the substrate 10 through the first and second openings 18 and 20 via the first and second insulating layers 12 and 14 forming first and second clusters 22 and 24, respectively of arsenic ions at the surface of the substrate 10. After the ion clusters 22 and 24 are formed, a second layer of photo resist 26 is disposed over the opening 18 in the first photo resist layer 16 and by employing selective dry plasma etching techniques an opening 28 is formed in the silicon nitride layer 14. Through the opening 28 arsenic ions are again introduced into the substrate 10 at a higher density to form one or more additional clusters 30 of arsenic ions below or near the second cluster 24 providing a high concentration of arsenic ions below the opening 28 in silicon nitride layer 14.

Figure 2:
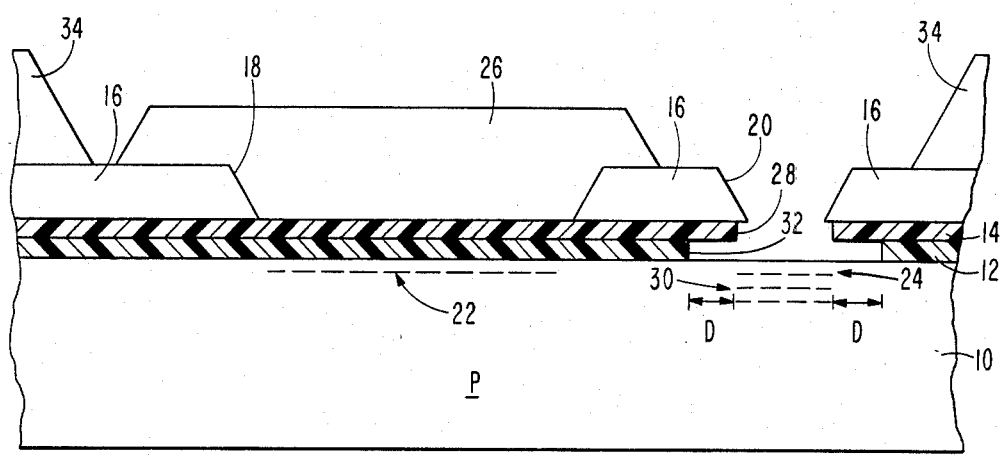

An opening 32 in the silicon dioxide layer 12 is then formed by a suitable etchant, such as hydrofluoride, which undercuts the silicon nitride layer 14 by a substantial distance D, e.g., 0.3 to 1.0 microns, as indicated in FIG. 2 of the drawings.

If support circuits disposed at other locations on the substrate 10 are to be protected from the etchant used to form opening 32 in the silicon dioxide layer 12, a third layer of photo resist 34 may be formed over the structure in regions remote from the opening 20 in the first photo resist layer 16 which require protection.

Figure 3:
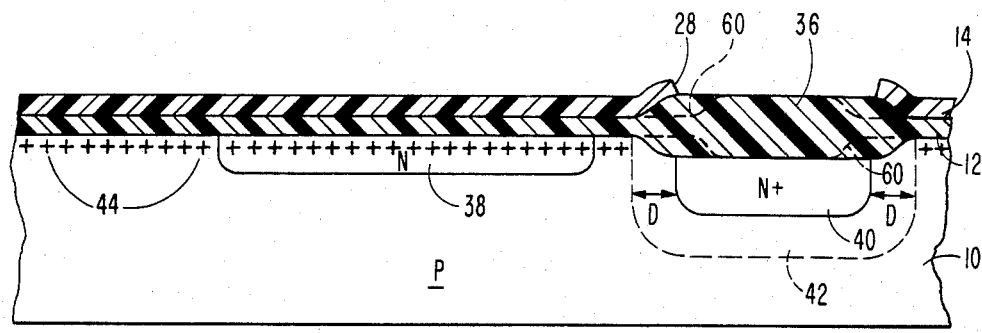

As indicated in FIG. 3 of the drawings, a thick silicon dioxide region 36 is grown to at least a thickness several times greater than the combined layer 12 and 14 thickness within the opening 32 of the silicon dioxide layer 12 by using known oxidization techniques at temperatures in excess of 800° C. This high temperature process not only forms the thick silicon dioxide layer 36, commonly known as a semirecessed oxide layer, but it also drives in the N type impurity ions in cluster 22 of FIGS. 1 and 2 to form a first N type region 38 and in clusters 24 and 30 to form a second region 40 of N+ type in the P type substrate 10. Since the substrate 10 is P type and the region 40 is N+ type, a depletion region 42 forms around the region 40 as is well known. A similar depletion region, not shown, also forms around N type region 38. To tailor the surface of the substrate 10, boron may be ion implanted as indicated at reference 44.

Figure 4:
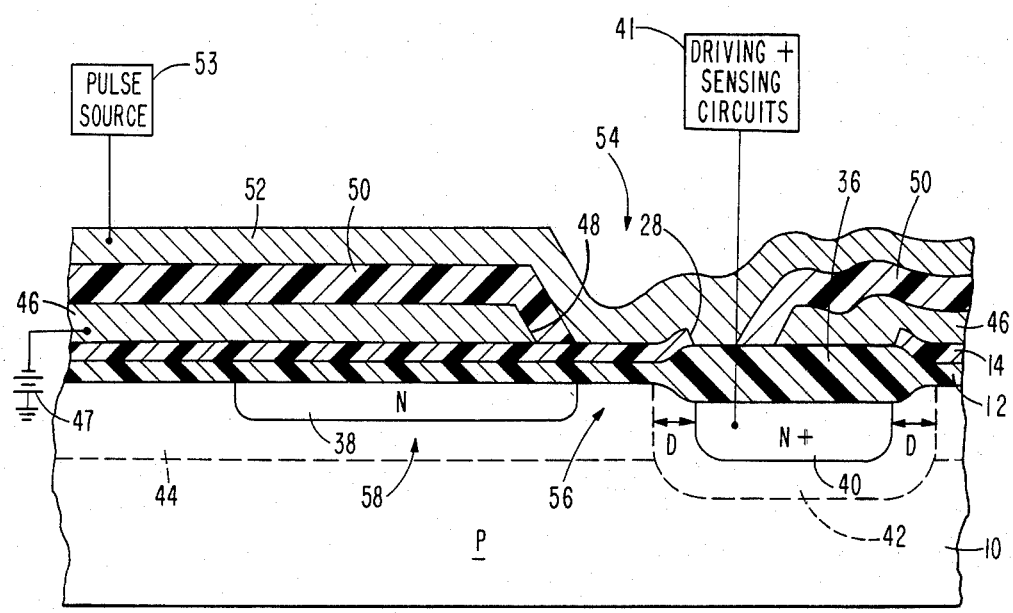

After the N type regions 38 and 40 and the thick silicon dioxide layer 36 are formed, doped polysilicon layer 46 is deposited on the silicon nitride layer 14 and the thick silicon dioxide layer 36, with an opening 48 provided therein by known etching techniques, such as with the use of a hydrofluoric and nitric acid solution, as illustrated in FIG. 4 of the drawings. The doped polysilicon layer 46, which acts as a field shield, extends over a portion of the thick silicon dioxide layer 36 and over a substantial portion of the N+ region 38. An insulating layer 50 is then preferably formed over the doped polysilicon layer 46 by growing silicon dioxide from the polysilicon layer 46. A conductive layer, preferably made of copper doped aluminum, is deposited over the structure and appropriately etched to form a conductive line 52, or liftoff techniques may be employed. Conventional driving and sensing circuits 41 are connected to the N+ region 40 and a conventional pulse source 53 is connected to conductive line 52, acting as a word line, for writing and reading the memory cell in any known manner. A source of negative potential 47, e.g., −2.2 volts, or ground potential, is applied to the polysilicon layer 46 so as to form a field shield.

As can be seen in FIG. 4, the process described hereinabove has produced a field effect transistor 54 having source/drain regions 38 and 40 defining a channel region 56 therebetween, with the portion of the conductive line 52 disposed over the channel region 56 acting as the gate electrode of transistor 54. Furthermore, this process has produced a capacitor 58 formed by the N type region 38 and the polysilicon layer or field shield 46. By using N type region 38 as the storage node of capacitor 58, N+ region 40 as a bit/sense line and the conductive line 52 as a word line, the process has produced a one device dynamic memory cell which has a low bit/sense line capacitance and a high transfer ratio, where the transfer ratio is equal to the capacitance of the storage capacitor 58 over the capacitance of the bit/sense line 40.

The capacitance of the bit/sense line 40 has a relatively low value not only due to the thick silicon dioxide layer 36 formed between the N+ region 40 and the overlying conductive layers, i.e., the field shield 46 and the word line 52, but also because the thick silicon dioxide layer 36 is also located between the depletion region 42 and the overlying conductive layers 46 and 52, since the depletion region 42 also contributes to the bit/sense line capacitance by field fringing from region 40 to layers 46 and 52.

Although the portion of the thick insulating layer 36 located between the N+ region 40 and the outside edge of the depletion region 42, known as a bird's beak, is generally detrimental to normal transistor operation, producing low transconductance and a high threshold voltage, it is acceptable and desirable for use in a one device dynamic memory. It is known that the turn on of a transistor is dependent primarily upon the voltage differential between the gate electrode and the source region at which conduction begins in the channel region. Accordingly, when a high voltage is applied to region 40 during a write or read operation of the memory or cell, charge is selectively applied to the capacitor 58 from the bit/sense line 40, the source of the transistor being region 38 which is separated from the gate electrode 52 by only a thin dielectric medium, layers 12 and 14, and acting as a source follower. Thus, during the write or read operation when a high voltage is applied to region 40, the transistor 54 has a low threshold voltage with no deleterious effect from the bird's beak. When a low voltage is applied to the region 40 during a write operation of the memory or cell, the N+ region 40 acts as the source of the transistor 54, however, at this time a full or high voltage is normally applied to the word line 52 which has sufficient overdrive readily inverting the channel region 56 even with the presence of the bird's beak at the source of the transistor.

By using the structure of the present invention, a memory cell is provided which does not require complex and sensitive sense amplifiers to detect a data signal transferred from the storage node 38 to the bit/sense line 40. Furthermore, by using the process of the present invention, the storage capacitor 58 of adjacent cells can be located more closely to each other since the storage node 38 is readily made with a shallow diffusion region reducing the punch through distance, the N region 38 being readily disposed within the boron tailoring region 44. Likewise, the bit/sense line 40 of one cell can be located more closely to the storage node of an adjacent cell in view of the shallowness of the storage node 38. Also, the transistor channel length control is improved by using the process of the present invention since no etching is required to define the channel region.

The distance D of the undercut of the silicon dioxide layer 12 beyond the opening 28 in the silicon nitride layer 14 may be determined by several factors including the kind and amount of impurity 24 and 30 introduced into the substrate 10 and the amount of migration of the impurity during the hot oxidation process which produces the thick silicon dioxide layer 36. By again referring to FIG. 3 of the drawings, it can be seen by dashed lines 60 that without the undercutting step, a very thin dielectric medium, layers 12 and 14, would be provided between the depletion region 42 and a portion of the N+ region on the one hand and the conductive layers, 46 and 52, on the other hand which would form a high bit/sense line capacitance. Such a high capacitance line would tend to lose a small signal applied to it from the storage node 38.

Figure 5:
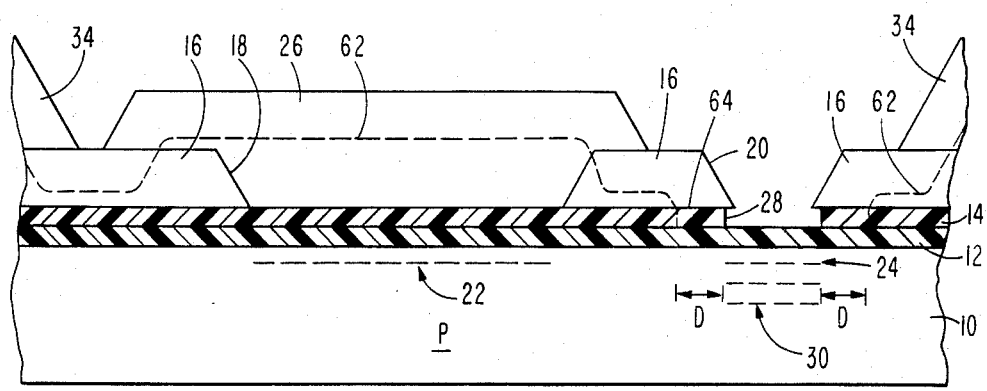
FIG. 5 is a sectional view of the memory cell of the present invention made at a step similar to that illustrated in FIG. 2 during the fabrication thereof in accordance with another process of this invention.

Another process which may be used to extend the bird's beak beyond the opening 28 in the silicon nitride layer 14 is indicated in the sectional view of FIG. 5 of the drawings which is made at a step similar to that illustrated in FIG. 2. As indicated in FIG. 5, after the ion clusters 22, 24 and 30 and the opening 28 in silicon nitride layer 14 have been formed, the photo resist layers 16, 26 and 34 are etched in a plasma oxygen atmosphere in a known manner until the upper portions thereof are removed to the dashed line 62. Consequently, a segment 64 of the silicon nitride layer 14 has its upper surface exposed and can now be etched away to shift the bird's beak growth again by the distance D from the ion clusters 24 and 30. Subsequent process steps are similar to those described hereinabove in connection with FIGS. 1-4.

It can be seen that in accordance with the teachings of this invention, a bird's beak is extended beyond the junction of the N+ region 40 and the P type substrate 10 into the depletion region 42 in order to substantially reduce the bit/sense line capacitance by reducing the fringing field component through the depletion region 42. This arrangement of the bird's beak in accordance with the teachings of this invention provides an asymmetrical field effect transistor which is more effective in the operation of a one device dynamic memory cell than are previously known structures. A memory array using field effect transistor cells produced in accordance with the teachings of the simple process of this invention has higher density and performance than do other arrays, particularly those employing field shields for controlling charge leakage between cells.

Although only one memory cell is indicated in FIGS. 1-5 as being connected to the bit/sense line 40, it should be undertsood that in practice one hundred or more cells would be connected to the bit/sense line 40. Thus, by reducing the capacitance of the bit/sense line at each cell, a substantial reduction in capacitance, at least 50%, has been realized along the total length of the bit/sense line.

If desired, the capacitance of the storage capacitor 58 may be increased by etching a portion of the silicon nitride layer 14 within the opening 18 in the first photo resist layer 16 prior to depositing the second photo resist layer 26.

While the invention has been particularly shown and described with reference to preferred embodiments thereof, it will be understood by those skilled in the art that various changes in form and details may be made therein without departing from the spirit and scope of the invention.

What is claimed is:
1. A memory cell comprising;
a semiconductor substrate of a first conductivity type having spaced apart storage node and bit/sense line diffusion regions of a second conductivity type defining a channel region,
a first insulating layer having a given substantially uniform thickness disposed over said storage node diffusion region and extending over a first portion of said channel region,
a second insulating layer disposed over said bit/sense line diffusion region and extending over the remaining portion of said channel region adjacent said bit/sense line diffusion region, the thickness of said second insulating layer over said bit/sense line diffusion region and over the remaining portion of said channel region being substantially thicker than said given thickness,
a control gate disposed over said channel region, said first and second insulating layers being disposed between said channel region and said control gate, said control gate being spaced from the first portion of said channel region by a distance equal to the thickness of said first insulating layer and from the remaining portion of said channel region and from said bit/sense line diffusion region by a distance equal to the thickness of said second insulating layer, and
conducting means disposed over said first and second insulating layers and insulated from said control gate, said conducting means having an opening over said channel region.
2. A memory cell comprising;
a semiconductor substrate of a given type conductivity having spaced apart storage node and bit/sense line diffusion regions of an opposite type conductivity defining a channel region at the surface of said substrate, said bit/sense line diffusion region having a depletion region adjacent thereto extending into a portion of said channel region,
an insulating medium having a first thickness disposed over said storage node region and extending over a portion of said channel region and a second thickness substantially thicker than that of said first thickness disposed over said bit/sense line diffusion region and extending over the remaining portion of said channel region,
a conductive layer disposed over said insulating medium having an opening therein over said channel region, and
a gate electrode disposed on said insulating medium over said channel region and insulated from said conductive layer.
3. A memory cell as set forth in claim 2 wherein said insulating medium having said second thickness is disposed over said depletion region in said channel region.
4. A memory cell as set forth in claim 3 wherein said insulating medium having said first thickness includes first and second insulating layers.
5. A memory cell as set forth in claim 4 wherein said second insulating layer is silicon nitride and said first insulating layer is silicon dioxide disposed between said second insulating layer and said substrate.
6. A memory cell as set forth in claim 5 wherein said substrate has a P type conductivity and said storage node and bit/sense line diffusion regions have an N type conductivity, said conductive layer is doped polysilicon and said gate electrode is made of aluminum.

7. A memory cell as set forth in claim 4 wherein said storage node region is substantially shallower than said bit/sense line diffusion region.

8. A memory cell as set forth in claim 4 wherein said substrate has a given P type conductivity and said storage node and said bit/sense line diffusion regions have an N type conductivity.

9. A memory cell as set forth in claim 1 wherein the thickness along substantially the entire length of said second insulating layer is several times the thickness of said first insulating layer.

* * * * *